(12) United States Patent
Steffler et al.

(10) Patent No.: US 10,468,336 B2
(45) Date of Patent: Nov. 5, 2019

(54) HIGH DENSITY SEMICONDUCTOR PACKAGE AND RELATED METHODS

(71) Applicant: SEMICONDUCTOR COMPONENTS INDUSTRIES, LLC, Phoenix, AZ (US)

(72) Inventors: Joseph S. Steffler, Waterloo (CA); Sukhminder S. Binapal, Campbellville (CA); Mark Vandermeulen, Burlington (CA)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 65 days.

(21) Appl. No.: 15/165,944

(22) Filed: May 26, 2016

(65) Prior Publication Data

US 2017/0345745 A1   Nov. 30, 2017

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC .... *H01L 23/49575* (2013.01); *H01L 21/4825* (2013.01); *H01L 21/565* (2013.01); *H01L 23/3114* (2013.01); *H01L 23/4952* (2013.01); *H01L 23/49503* (2013.01); *H01L 23/49541* (2013.01); *H01L 2224/48247* (2013.01); *H01L 2224/49171* (2013.01)

(58) Field of Classification Search
None
See application file for complete search history.

(56) References Cited

U.S. PATENT DOCUMENTS

| 6,426,559 | B1* | 7/2002 | Bryan | H01L 23/49575 257/777 |
|---|---|---|---|---|
| 2004/0113280 | A1* | 6/2004 | Kim | H01L 23/49503 257/777 |
| 2011/0316133 | A1* | 12/2011 | Do | H01L 21/561 257/676 |
| 2012/0193772 | A1* | 8/2012 | Jiang | H01L 23/49562 257/666 |
| 2017/0287816 | A1* | 10/2017 | Vreman | H01L 23/49513 |

* cited by examiner

*Primary Examiner* — Steven B Gauthier
(74) *Attorney, Agent, or Firm* — Adam R. Stephenson, Ltd.

(57) ABSTRACT

Implementations of semiconductor packages may include: a first semiconductor die having a plurality of balls coupled to a first side thereof, a second semiconductor die, a lead frame having a die attach area on a first side of the lead frame, the die attach area containing an opening therethrough and one or more wire bonds. The first semiconductor die may be coupled to a backside of the second semiconductor die by an adhesive on a second side of the first semiconductor die opposing the first side. The second semiconductor die may be mechanically and electrically coupled to the lead frame through one or more wire bonds at the die attach area. The first semiconductor die may be positioned within the opening in the center of the lead frame.

14 Claims, 5 Drawing Sheets

HIGH DENSITY SEMICONDUCTOR PACKAGE AND RELATED METHODS

BACKGROUND

1. Technical Field

Aspects of this document relate generally to semiconductor packages such as die connected to lead frames.

2. Background

Conventionally, to include multiple die on a single lead frame the several die are stacked and connected to the lead frame by wire bonding. In some situations, the die are connected with each other through the stacked connections as well.

SUMMARY

Implementations of semiconductor packages may include: a first semiconductor die having a plurality of balls coupled to a first side thereof, a second semiconductor die, a lead frame having a die attach area on a first side of the lead frame, the die attach area containing an opening therethrough and one or more wire bonds. The first semiconductor die may be coupled to a backside of the second semiconductor die by an adhesive on a second side of the first semiconductor die opposing the first side. The second semiconductor die may be mechanically and electrically coupled to the lead frame through one or more wire bonds at the die attach area. The first semiconductor die may be positioned within the opening in the center of the lead frame.

Implementations of semiconductor packages may include one, all, or any of the following:

The plurality of balls coupled to the first semiconductor die may extend through a plane formed by a surface of the lead frame opposing the first side of the lead frame.

The plurality of balls may be selected from the group consisting of solder balls, copper pillars, gold stud bumps or any combination thereof.

The first semiconductor die may be selected from the group consisting of electrically erasable programmable read-only memory (EEPROM), electrostatic discharge (ESD) protection die, a transistor or any combination thereof. In implementations the first semiconductor die may be some other type of device. In implementations the first die (and or other die) may form a portion of a larger overall system or larger overall circuit and/or may be supporting die of the larger overall system or circuit.

The first semiconductor die may be thinned in order to fit within the opening in the die attach area of the lead frame.

One or more semiconductor die may be coupled in a stacked arrangement to a front side of the second semiconductor die opposing the back side.

A majority of the lead frame, the second semiconductor die and the first semiconductor die may be encapsulated with a mold compound.

Implementations of semiconductor packages may include: a first semiconductor die having a plurality of balls coupled to a first side thereof and a second side opposing the first side, a semiconductor die having a first side and a second side opposing the first side, a lead frame having a die attach area and one or more leads and one or more connectors. The lead frame may have an opening in the die attach area sized to receive a perimeter of the first semiconductor die. The second side of the first semiconductor die may be coupled to the first side of the second semiconductor die. The second semiconductor die may be coupled to the lead frame at the first side placing the first semiconductor die into the opening of the die attach area. The one or more connectors may couple the second semiconductor die to the one or more leads.

Implementations of semiconductor packages may include one, all, or any of the following:

The plurality of balls coupled to the first semiconductor die may extend through a place formed by a surface of the lead frame opposing the first side of the lead frame.

The plurality of balls may be selected from the group consisting of solder balls, copper pillars, gold stud bumps or any combination thereof.

The first semiconductor die may be selected from the group consisting of EEPROM, ESD protection die, a transistor or any combination thereof. In implementations the first semiconductor die may be some other type of device. In implementations the first die (and or other die) may form a portion of a larger overall system or larger overall circuit and/or may be supporting die of the larger overall system or circuit.

The first semiconductor die may be thinned in order to fit within the opening in the die attach area of the lead frame.

One or more semiconductor die may be coupled in a stacked arrangement to a front side of the second semiconductor die opposing the back side.

A majority of the lead frame, the second semiconductor die and the first semiconductor die may be encapsulated with a mold compound.

Implementations of a semiconductor package may be manufactured using implementations of a method of making semiconductor packages. The method may include providing a second semiconductor die having a first side and a second side. The method may include coupling a first semiconductor die having a plurality of balls coupled to a first side thereof to the first side of the second semiconductor die and coupling the first side of the second semiconductor die to a die flag of a lead frame, the die flag comprising an opening therethrough sized to receive the first semiconductor die. The method may also include placing the first semiconductor die into the opening in the die flag and coupling one or more connectors to one or more pads on the second side of the second semiconductor die and to one or more leads of the lead frame. The method may include encapsulating a majority of the lead frame, the second semiconductor die and the first semiconductor die with a mold compound.

Implementations of a method for making semiconductors may include one, all, or any of the following:

The plurality of balls may be selected from the group consisting of solder balls, copper pillars, gold stud bumps or any combination thereof.

The first semiconductor die may be selected from the group consisting of EEPROM, ESD protection die, a transistor or any combination thereof. In implementations the first semiconductor die may be some other type of device. In implementations the first die (and or other die) may form a portion of a larger overall system or larger overall circuit and/or may be supporting die of the larger overall system or circuit.

The first semiconductor die may be thinned in order to fit within the opening in the die attach area of the lead frame.

One or more semiconductor die may be coupled in a stacked arrangement to a front side of the second semiconductor die opposing the back side.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package and method for making semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
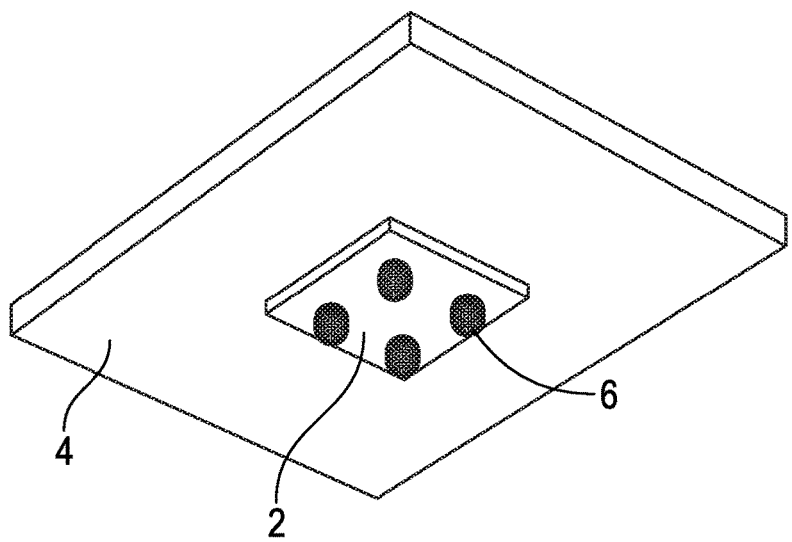
FIG. 1 is a bottom view of an implementation of a first semiconductor die attached to the backside/first side of a second semiconductor die.

FIG. 1 illustrates a first semiconductor die 2 coupled to the backside/first side of a second semiconductor die 4. The first semiconductor die 2 may be coupled to the second semiconductor die 4 by an adhesive. The adhesive may include an epoxy, tape, solder and any other method for attaching die together. By non-limiting example, the first semiconductor die 2 may be electrically erasable programmable read-only memory (EEPROM), electrostatic discharge (ESD) protection, a transistor or any combination thereof. In implementations the first semiconductor die may be some other type of device. In implementations the first die (and or other die) may form a portion of a larger overall system or larger overall circuit and/or may be supporting die of the larger overall system or circuit. The first semiconductor die 2 may have a plurality of balls 6 coupled to a first side thereof. The plurality of balls 6 may include solder balls, copper pillars, gold stud bumps or any combination thereof.

Figure 2:
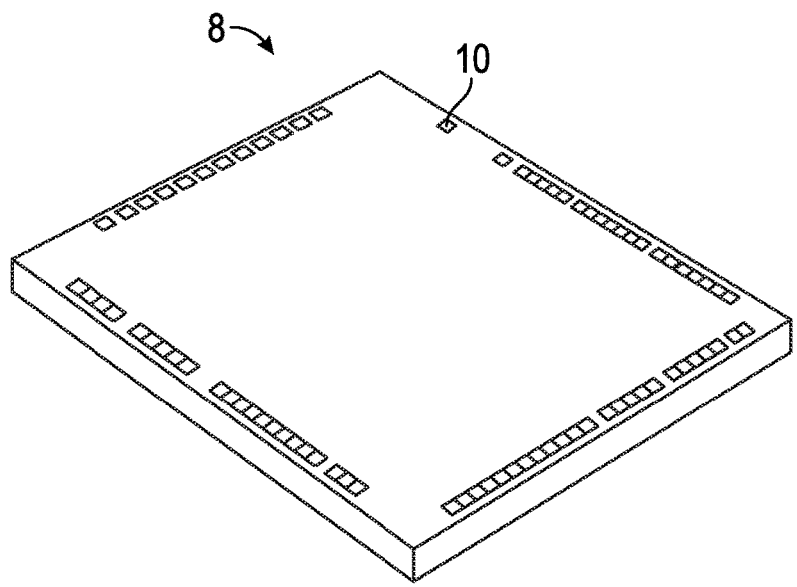
FIG. 2 is a top view of a standard wire bonded die.

Referring to FIG. 2, the top view of a wire bonded die 8 is illustrated. The wire bonded die 8 is an example of a type of die that may be used as the second semiconductor die in implementations of a semiconductor package. One or more pads 10 are illustrated on the front side/second side of the second semiconductor die 8. In an implementation of a semiconductor package, the second semiconductor die 8 may be coupled to a lead frame by one or more connectors coupling the pads 10 of the second semiconductor die 8 to leads of a lead frame. In various implementations, the one or more connectors are wire bonds.

Figure 3:
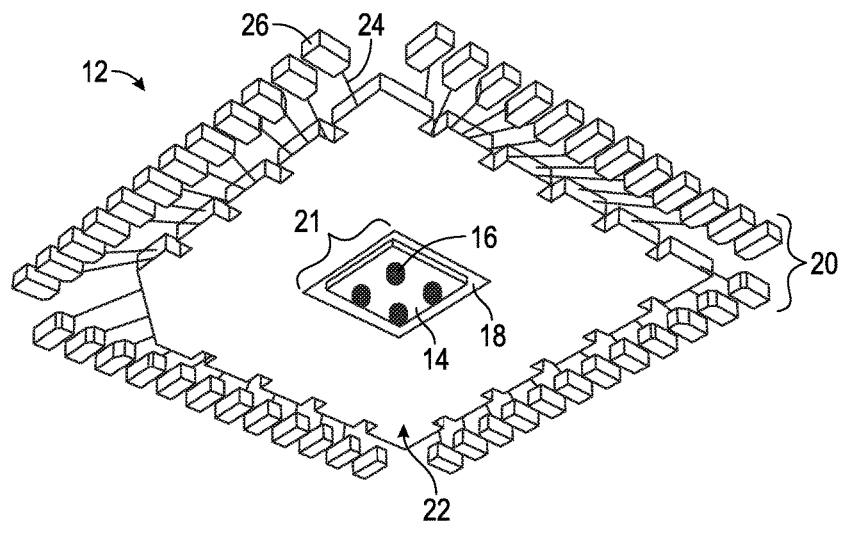
FIG. 3 is a bottom view of an implementation of a semiconductor package.

Referring to FIG. 3, a bottom view of an implementation of a semiconductor package 12 is illustrated. A plurality of balls 16 are coupled to the first side of a first semiconductor die 14 may have. The first semiconductor die 14 is coupled to a backside/first side of a second semiconductor die 18 by an adhesive on the second side of the first semiconductor die 14. The lead frame 20 has an opening 21 in the die attach area/flag 22 sized to receive a perimeter of a first semiconductor die 14. The second semiconductor die 18 is mechanically and electrically coupled to the lead frame 20 by connectors 24 coupling the second semiconductor die 18 to the leads 26 of the lead frame 20. By non-limiting example, the connectors may be wire bonds made from aluminum, copper, silver, gold or any combination known in the art. The first semiconductor die 14 may be thinned in order to fit within the opening 21 of the die attach area/flag 22 between the second semiconductor die 18 and a plane formed by a surface of the lead frame 20 opposing the first side of the lead frame 20. Thinning may be performed by any methods known in the art, such as, by non-limiting example, back grinding, polishing, lapping, chemical mechanical polishing, etching, any combination thereof, and any other methods of thinning a planar surface. The plurality of balls 16 coupled to the first semiconductor die 14 extend through the plane formed by a surface of the lead frame 20 opposing the first side of the lead frame 20.

Figure 4:
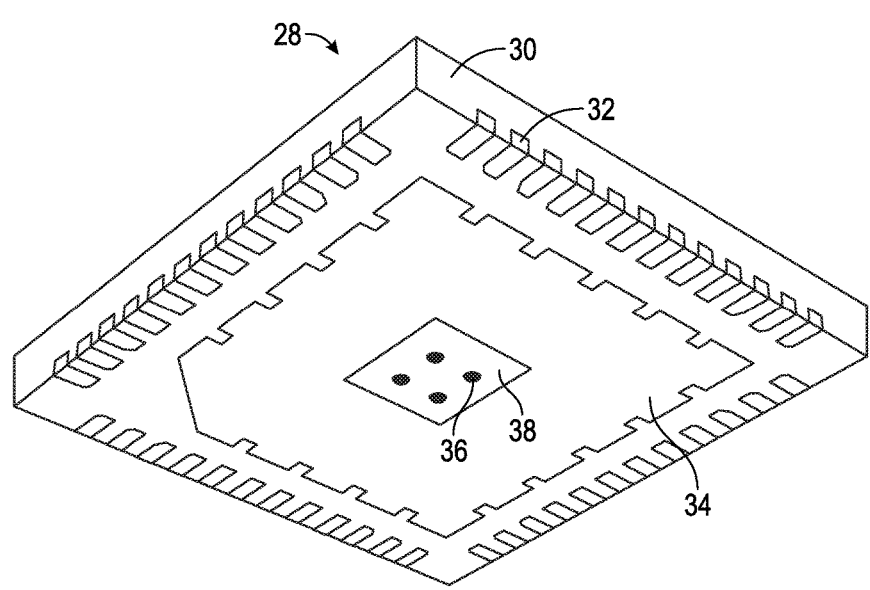
FIG. 4 is a bottom view of another implementation of a semiconductor package.

Referring to FIG. 4, another implementation of a semiconductor package 28 is illustrated. The semiconductor package 28 may be enclosed in a mold cap/compound 30. The mold cap/compound 30 may include, by non-limiting example, resin, epoxy or any similar compounds known in the art. The leads 32 and the die attach area/flag 34 of the lead frame may be in the same plane as the mold cap/compound 30. The plurality of balls 36 coupled to the first semiconductor die 38 extend from the plane of the mold cap/compound 30. Various implementations of a semiconductor package 28 may also include, by non-limiting example, quad flat no-leads (QFN) packages, dual flat no-leads (DFN) packages, quad flat package (QFP) and similar packages known in the art.

Figure 5A:
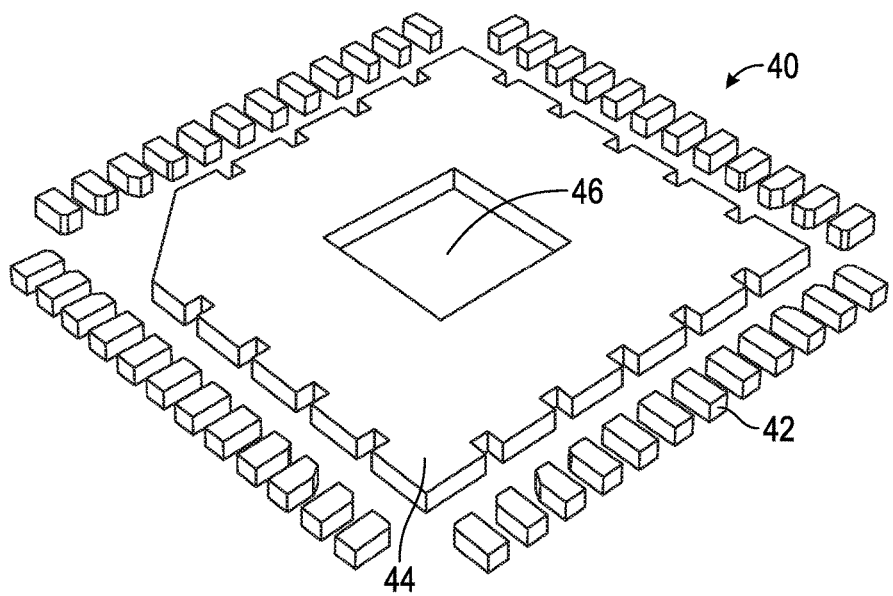
FIG. 5A-5E shows various processing steps involved in an implementation of a method for making a semiconductor package.

Referring to FIG. 5A-5E, implementations of processing steps of a method of manufacturing a semiconductor package are illustrated. FIG. 5A illustrates providing a lead frame 40. The lead frame has leads 42 and a die attach area/flag 44. The die flag has an opening 46 sized to receive a first semiconductor die 52 coupled to a first side of a second semiconductor die 48. The opening 46 in the die flag 44 may be made, by non-limiting example, by punching, stamping, laser cutting, molding, casting and any other methods known in the art.

Figure 5B:
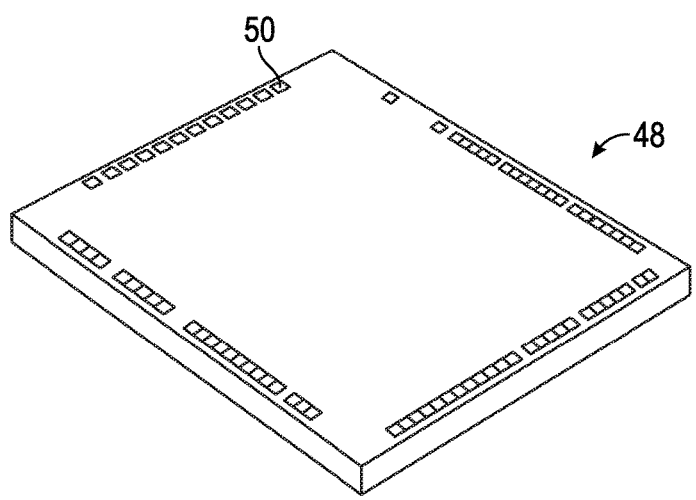
Figure 5C:
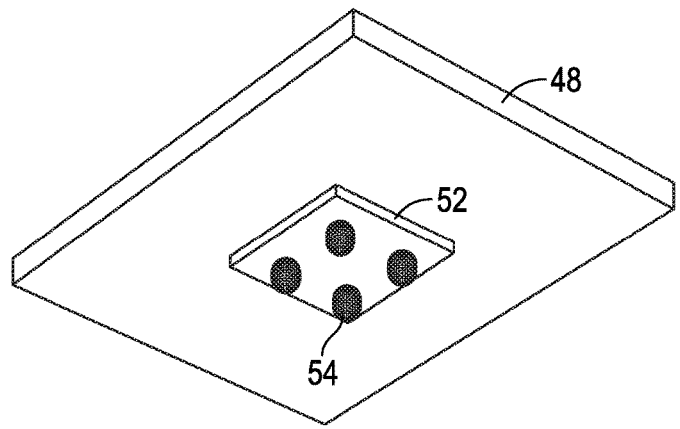

Referring to FIG. 5B, providing a second semiconductor die 48 is illustrated. One or more semiconductor die may be coupled in a stacked arrangement to a front side/second side of the second semiconductor 48 die opposing the back side/first side thereof. FIG. 5C illustrates coupling a first semiconductor die 52 to a backside/first side of a second semiconductor die 48. The first semiconductor die 52 may have a plurality of balls 54 coupled to the first side thereof. The second side of the first semiconductor die 52 may be coupled to the first side of the second semiconductor die 48 by an adhesive which may be any of those disclosed herein. Prior to coupling, the process of applying the adhesive may also be included in method implementations.

Figure 5D:
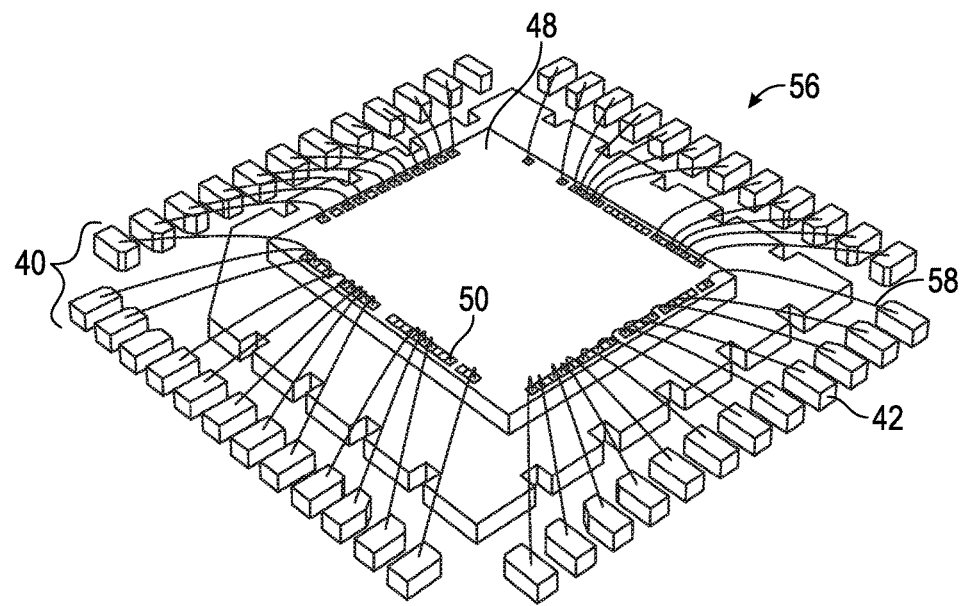

Referring to FIG. 5D, coupling of the second semiconductor die 48 to the lead frame 40 is illustrated. The first side/backside of the second semiconductor die 48 may be coupled to the lead frame 40 by an adhesive. The adhesive may include epoxy, tape, solder and any other adhesive disclosed herein. The first semiconductor die 52 may be placed into the opening 46 in the die flag 44 as the second semiconductor die 48 is coupled to the lead frame 40. The second side of the second semiconductor die 48 is coupled to the lead frame 40 by connectors 58. More specifically, the connectors 58 couple the pads 50 of the second semiconductor die 48 to the leads 42 of the lead frame 40. By adding the first semiconductor die 52 in close proximity to the second semiconductor die 48 and the lead frame 40, the capacity of the semiconductor package 56 to route and/or include die may be increased without adding to the amount of space needed on a circuit board. The first semiconductor die 52 may also benefit by receiving thermal relief from the second semiconductor die 48. Furthermore, overall circuit performance for a package having the above die configuration may be superior to that of a package having die in a side-by-side configuration because the close proximity of connections helps minimize impacting circuit conditions and because connections between the first and second die may be consistent and repeatable across designs due to the inter-die connections being unaffected by other components placed around the package or die. In conventional packages/circuits where die are placed side-by-side the inter-die connections may be affected/altered by other components that will be placed around the die and/or on/around the package (this may also be the case, for example, for a circuit that includes multiple semiconductor packages), as these will also need connection locations, so that the connections between die may be less than ideal.

Figure 5E:
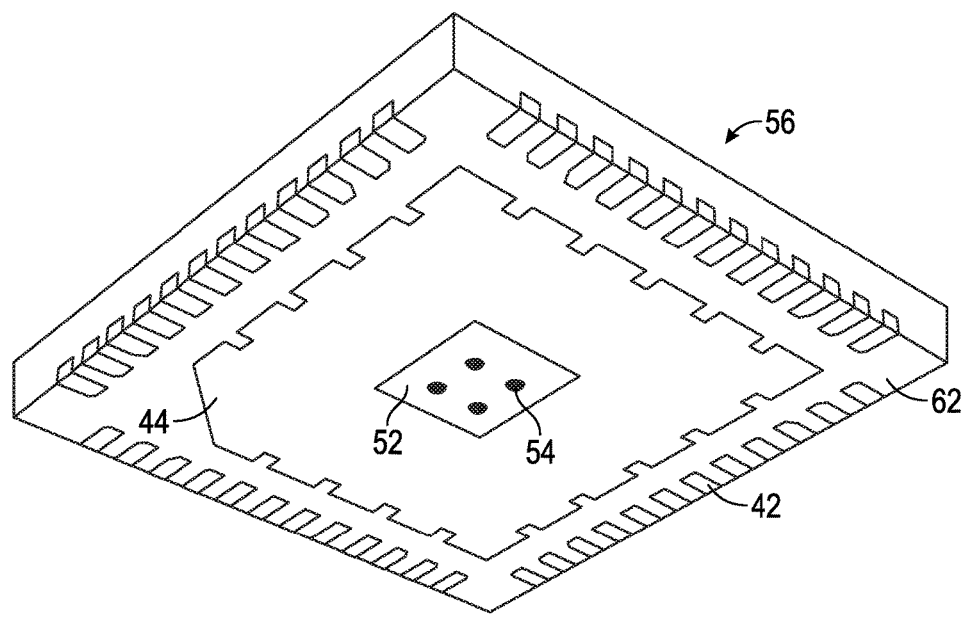

Referring to FIG. 5E, encapsulating the semiconductor package 56 with a mold compound/cap 62 is illustrated. The majority of the lead frame 40, the second semiconductor die 48, and the first semiconductor die 52 are covered with the mold compound/cap 62. The mold compound/cap 62 provides a seal around the semiconductor package 56 protecting the dice 48, 52 and connectors 58 from moisture.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a first semiconductor die having a plurality of balls coupled to a first side thereof;
   a second semiconductor die;
   a lead frame having a die attach flag on a first side of the lead frame, the die attach flag containing an opening therethrough; and
   one or more wire bonds;
   wherein the first semiconductor die is coupled to a backside of the second semiconductor die by an adhesive on a second side of the first semiconductor die opposing the first side;
   wherein the backside of the second semiconductor die is directly coupled to a first side of the die attach flag through a second adhesive;
   wherein the second semiconductor die is mechanically and electrically coupled to the lead frame through the one or more wire bonds and the first semiconductor die is positioned within the opening in the center of the die attach flag; and
   wherein a perimeter of the second side of the first die is smaller than a perimeter of the opening on the first side of the die attach flag.

2. The semiconductor package of claim 1, wherein the plurality of balls coupled to the first semiconductor die extend through a plane formed by a surface of the lead frame opposing the first side of the lead frame.

3. The semiconductor package of claim 1, wherein the plurality of balls are selected from the group consisting of solder balls, copper pillars, gold stud bumps, and any combination thereof.

4. The semiconductor package of claim 1, wherein the first semiconductor die selected from the group consisting of electrically erasable programmable read-only memory (EEPROM), electrostatic discharge (ESD) protection die, a transistor, and any combination thereof.

5. The semiconductor package of claim 1, wherein the first semiconductor die is thinned in order to fit within the opening in the die attach flag of the lead frame.

6. The semiconductor package of claim 1, further comprising one or more semiconductor die coupled in a stacked arrangement to a front side of the second semiconductor die opposing the back side.

7. The semiconductor package of claim 1, wherein an entire surface of the die attach flag, opposite the surface attached to the second semiconductor die, is fully and continuously exposed through a mold compound.

8. A semiconductor package comprising:
   a first semiconductor die having a plurality of balls coupled to a first side thereof and a second side opposing the first side;
   a second semiconductor die having a first side and a second side opposing the first side;
   a lead frame having a die attach flag and one or more leads; and
   one or more connectors;
   wherein the lead frame has an opening in the die attach flag sized to receive a perimeter of the first semiconductor die;
   wherein the entire second side of the first semiconductor die is directly coupled to the first side of the second semiconductor die through a first adhesive;
   wherein the first side of the second semiconductor die is directly coupled to a first side of the die attach flag through a second adhesive, placing the first semiconductor die into the opening of the die attach flag;
   wherein a perimeter of the first semiconductor die facing the second semiconductor die is smaller than a perimeter of the second semiconductor die facing the first semiconductor die;
   wherein the first side of the die attach flag is substantially coplanar with the second side of the first semiconductor die; and
   wherein the one or more connectors couple the second semiconductor die to the one or more leads.

9. The semiconductor package of claim 8, wherein the plurality of balls coupled to the first semiconductor die extend through a plane formed by a surface of the lead frame opposing the first side of the lead frame.

10. The semiconductor package of claim 8, wherein the plurality of balls are selected from the group consisting of solder balls, copper pillars, gold stud bumps, and any combination thereof.

11. The semiconductor package of claim 8, wherein the first semiconductor die is selected from the group consisting of electrically erasable programmable read-only memory (EEPROM), electrostatic discharge (ESD) protection die, a transistor, and any combination thereof.

12. The semiconductor package of claim 8, wherein the first semiconductor die is thinned in order to fit within the opening in the die attach flag of the lead frame.

13. The semiconductor package of claim 8, further comprising one or more semiconductor die coupled in a stacked arrangement to the second side of the second semiconductor die opposing the first side.

14. The semiconductor package of claim 8, wherein an entire surface of the die attach flag, opposite the first side of the die attach flag, is fully and continuously exposed through a mold compound.

\* \* \* \* \*